US011177427B2

(12) United States Patent
Bedell et al.

(10) Patent No.: US 11,177,427 B2
(45) Date of Patent: Nov. 16, 2021

(54) FABRICATION OF MAGNETIC NANOWIRE FOR MAJORANA QUBITS

(71) Applicant: INTERNATIONAL BUSINESS MACHINES CORPORATION, Armonk, NY (US)

(72) Inventors: Stephen W. Bedell, Wappingers Falls, NY (US); Steven J. Holmes, Ossining, NY (US); Ning Li, White Plains, NY (US); Devendra K. Sadana, Pleasantville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/791,436

(22) Filed: Feb. 14, 2020

(65) Prior Publication Data
US 2021/0257536 A1 Aug. 19, 2021

(51) Int. Cl.
*H01L 39/02* (2006.01)
*H01L 39/24* (2006.01)
*H01L 39/12* (2006.01)

(52) U.S. Cl.
CPC .......... *H01L 39/2403* (2013.01); *H01L 39/12* (2013.01)

(58) Field of Classification Search
None
See application file for complete search history.

(56) References Cited

U.S. PATENT DOCUMENTS

| 10,020,438 B2 | 7/2018 | Yazdani et al. |
|---|---|---|
| 10,236,178 B2 | 3/2019 | Ohlsson et al. |
| 10,403,809 B2 | 9/2019 | Krogstrup et al. |
| 2014/0279822 A1 | 9/2014 | Bonderson |
| 2017/0141287 A1* | 5/2017 | Barkeshli ............. H01L 39/223 |
| 2018/0052806 A1 | 2/2018 | Hastings et al. |
| 2018/0053809 A1 | 2/2018 | Freedman et al. |
| 2018/0248566 A1* | 8/2018 | Hastings ............... H03M 13/19 |
| 2019/0013457 A1 | 1/2019 | Lutchyn et al. |
| 2019/0214561 A1 | 7/2019 | Schrade et al. |
| 2020/0356887 A1* | 11/2020 | Moodera ............... H01L 39/228 |

FOREIGN PATENT DOCUMENTS

WO 2019074557 A1 4/2019

OTHER PUBLICATIONS

Kirsebom, "Fabrication of Nanowire-based Majorana Devices", 2015 University of Copenhagen.

(Continued)

*Primary Examiner* — Benjamin P Sandvik
(74) *Attorney, Agent, or Firm* — Henry J. Daley; Venable LLP

(57) ABSTRACT

According to an embodiment of the present invention, a method for fabricating a *Majorana* fermion structure includes providing a substrate, and depositing a superconducting material on the substrate. The method includes depositing a magnetic material on the superconducting material using angled deposition through a mask. The method includes annealing the magnetic material and the superconducting material to form a magnetic nanowire partially embedded in the superconducting material such that the magnetic nanowire and the superconducting material form a *Majorana* fermion structure.

20 Claims, 8 Drawing Sheets

(56) References Cited

OTHER PUBLICATIONS

Nadj-Perge et al., Observation of Majorana fermions in ferromagnetic atomic chains on a superconductor, Research, Oct. 31, 2014 • vol. 346 Issue 6209, pp. 602-607.
Li et al., "Majorana spin in magnetic atomic chain systems", Physical Review B 97, 125119 (2018).
Feldman et al., "High-resolution studies of the Majorana atomic chain platform", Nature Physics, vol. 13, Mar. 2017.
Li et al., "Manipulating Majorana zero modes on atomic rings with an external magnetic field", Nature Communications, DOI: 10.1038/ncomms10395.
Ruby et al., "End States and Subgap Structure in Proximity-Coupled Chains of Magnetic Adatoms", Physical Review Letters 115, 197204 (2015).
Morten Kjaergaard et al., "Majorana fermions in superconducting nanowires without spin-orbit coupling", arXiv:1111.2129v4 [cond-mat.mes-hall] Jul. 16, 2014.
Zlatko Papic et al.,, " Imaging Anyonswith Scanning Tunneling Microscopy", Physical Review X 8, 011037 (2018).
Frank Schindler et al., "Higher-order topology in bismuth", Nature Physics, vol. 14 , Sep. 2018, 918-924.

* cited by examiner

FABRICATION OF MAGNETIC NANOWIRE FOR MAJORANA QUBITS

BACKGROUND

The currently claimed embodiments of the present invention relate to quantum mechanical devices, and more specifically, to fabrication of a magnetic nanowire for *Majorana* qubit applications.

*Majorana* qubits are desired due to the possibility of long coherence times, but they require new types of nanowires for their fabrication. Magnetic nanowires of Fe formed over a superconductor metal such as Pb have been shown to exhibit *Majorana* fermion behavior. The current fabrication method for the nanowires in these devices, however, creates randomly positioned segments of nanowires, attached to larger agglomerations of Fe atoms.

SUMMARY

According to an embodiment of the present invention, a method for fabricating a *Majorana* fermion structure includes providing a substrate, and depositing a superconducting material on the substrate. The method includes depositing a magnetic material on the superconducting material using angled deposition through a mask. The method includes annealing the magnetic material and the superconducting material to form a magnetic nanowire partially embedded in the superconducting material such that the magnetic nanowire and the superconducting material form a *Majorana* fermion structure.

According to an embodiment of the present invention, a quantum mechanical device includes a substrate and an array of *Majorana* fermion structures formed on the substrate. Each *Majorana* fermion structure includes a superconducting material formed on the substrate, and a magnetic nanowire partially embedded in the superconducting material.

DETAILED DESCRIPTION

Figure 1:
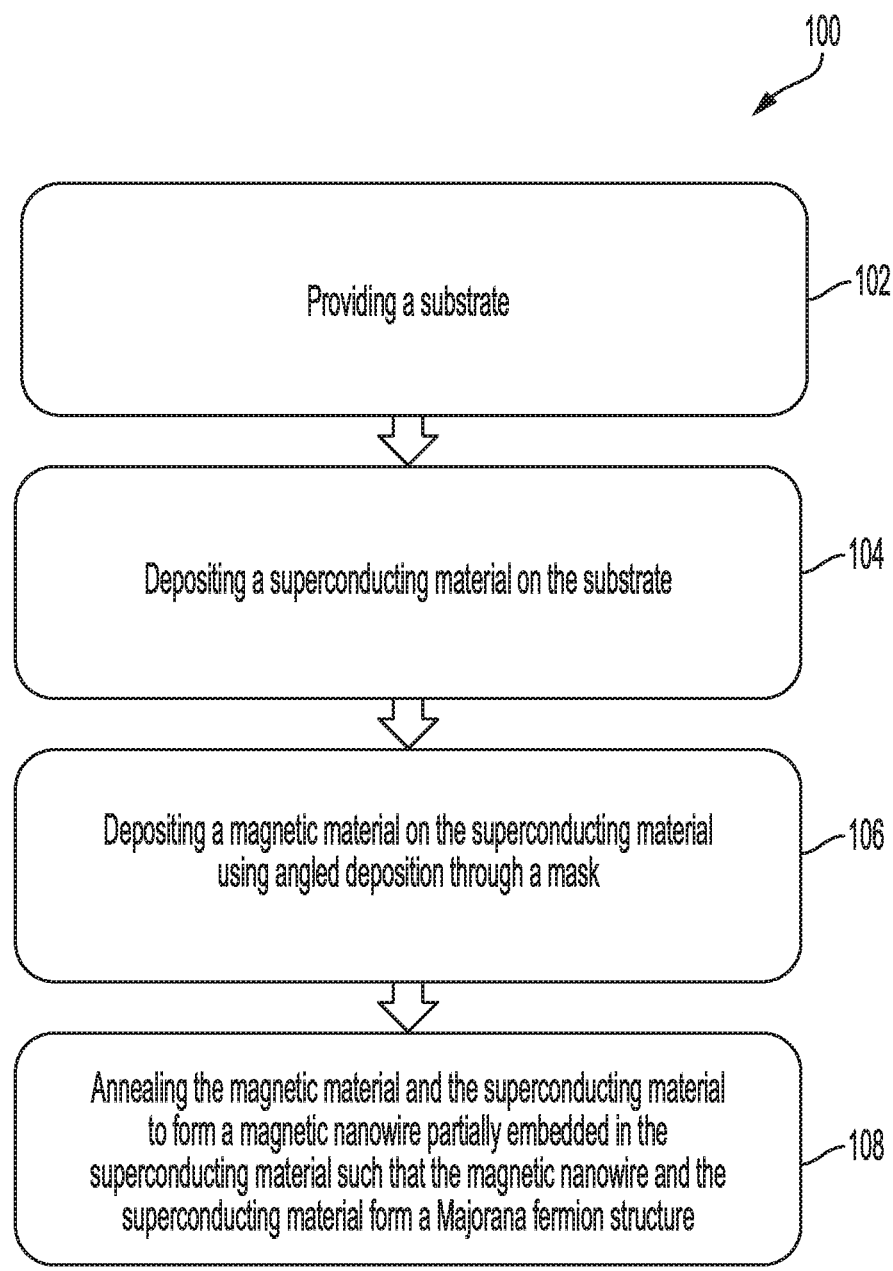
FIG. 1 is a flowchart illustrating a method for fabricating a *Majorana* fermion structure according to an embodiment of the present invention.

FIG. 1 is a flowchart illustrating a method 100 for fabricating a *Majorana* fermion structure according to an embodiment of the invention. The method 100 includes providing a substrate 102, and depositing a superconducting material on the substrate 104. The method 100 includes depositing a magnetic material on the superconducting material using angled deposition through a mask 106. The method 100 includes annealing the magnetic material and the superconducting material to form a magnetic nanowire partially embedded in the superconducting material such that the magnetic nanowire and the superconducting material form a *Majorana* fermion structure 108.

According to some embodiments of the present invention, the method 100 for fabricating a *Majorana* fermion structure includes applying a magnetic field to the magnetic material and the superconducting material during the annealing of the magnetic material and the superconducting material to form the magnetic nanowire. The magnetic field may be applied such that field lines of the magnetic field align with a desired length direction of the magnetic nanowire.

According to some embodiments of the present invention, depositing the superconducting material includes forming the mask on the substrate, patterning the mask to expose a portion of the substrate, and depositing the superconducting material on the exposed substrate. According to some embodiments, depositing the magnetic material on the superconducting material includes depositing the magnetic material on the superconducting material using angular deposition through the patterned mask. According to some embodiments, the method 100 includes applying the magnetic field during the depositing the magnetic material on the superconducting material.

According to some embodiments of the present invention, the superconducting material has a width between 10 nm and 30 nm. According to some embodiments, depositing the magnetic material on the superconducting material includes depositing the magnetic material to have a width less than or equal to 10 nm. According to some embodiments, depositing the magnetic material on the superconducting material comprises depositing a monolayer of the magnetic material.

According to some embodiments of the present invention, the superconducting material includes Pb. According to some embodiments, the superconducting material includes one or more of Nb, Ta, TaN, Sn, TiN, Ti, Al, V, for example. According to some embodiments, the magnetic nanowire includes one or more of Fe, Ni, and Co. According to some embodiments, the magnetic nanowire includes a ferromagnetic material.

According to some embodiments of the present invention, the method 100 further includes forming a second region of the superconducting material on the substrate in proximity with the first-mentioned superconducting material, the second region of superconducting material having a length direction parallel to a length direction of the first-mentioned superconducting material. The method 100 may further include forming a second magnetic nanowire partially embedded in the second region of the superconducting material.

Figure 2:
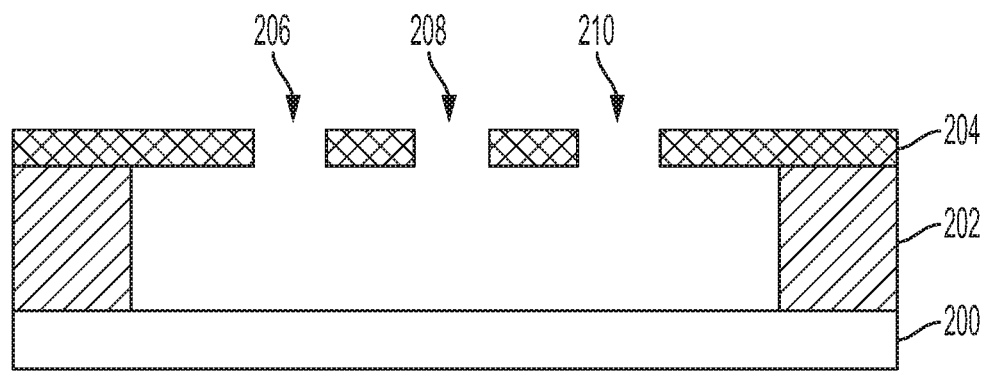
FIG. 2 is a schematic illustration of a cross-section of a substrate with a lift off structure formed thereon according to an embodiment of the present invention.

FIGS. 2-5 schematically illustrate an example process for fabricating a *Majorana* fermion structure according to an embodiment of the present invention. FIG. 2 is a schematic illustration of a cross-section of a substrate 200. The process includes forming a lift off structure for depositing a superconducting material and a magnetic material. The lift off structure may include a support structure 202 such as an organic solvent, for example. The lift off structure may also include a hard mask 204 supported by the support structure 202. The hard mask may include, for example, Si or Ti. The support structure 202 and hard mask 204 may be patterned to include through holes 206, 208, 210.

Figure 3:
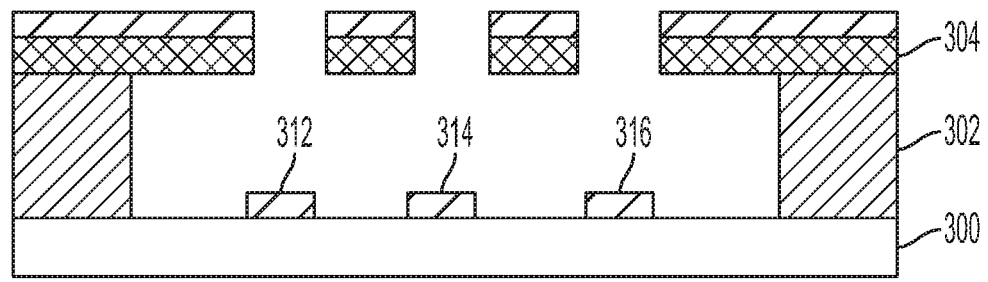
FIG. 3 is a schematic illustration of a cross-section of a substrate with a superconducting material deposited thereon according to an embodiment of the present invention.

The process includes depositing a superconducting material on the substrate. FIG. 3 is a schematic illustration of a cross-section of a substrate 300 with a superconducting material 312 deposited thereon. The superconducting material 312 may be deposited using vertical deposition or using angular deposition. The superconducting material 312 may pass through the hard mask 304 supported by the support structure 302. A plurality of holes 306, 308, 310 in the hard mask 304 may be used to form a plurality of regions 312, 314, 316 of superconducting material. The regions 312, 314, 316 may be formed to have a particular shape such as, for example, a nanorod or a nanowire. According to an embodiment of the present invention, the regions 312, 314, 316 may each have a width of about 50 nm-about 100 nm and a length of about 500 nm or more.

Figure 4:
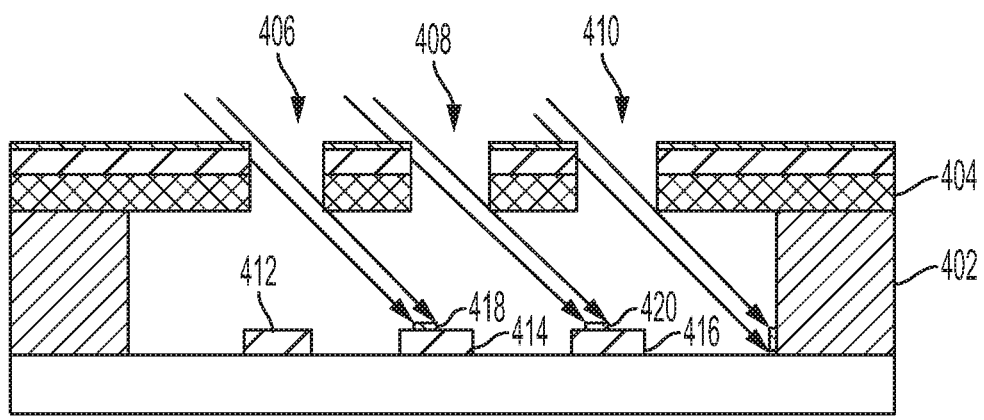
FIG. 4 is a schematic illustration of angled deposition of magnetic material according to an embodiment of the present invention.

The process includes depositing a magnetic material on the superconducting material using angled deposition through the mask. FIG. 4 is a schematic illustration of angled deposition of the magnetic material 418. As illustrated in FIG. 4, the same support structure 402 and hard mask 404 that were used to deposit the regions 412-416 of superconducting material can also be used to form regions 418, 420 of magnetic material on regions 414, 416 of superconducting material. The use of angled deposition enables formation of regions 418, 420 of magnetic material having widths that are narrower than the widths of the holes 406-410 in the hard mask 404. For example, the regions 418, 420 of magnetic material may have widths of about 5 nm-10 nm. The magnetic material may be deposited at an angle chosen for a particular size and position of the region of magnetic material. The magnetic material may be deposited at an angle greater than the angle of deposition of the superconducting material. The magnetic material may be deposited at a 30°, 45°, or 60° angle, for example. The magnetic material may be deposited at a plurality of angles, such that multiple regions of magnetic material are formed on a single region of superconducting material. The magnetic material may be deposited using molecular-beam epitaxy (MBE), for example. The deposition may be limited to a monolayer of magnetic material. According to some embodiments of the present invention, a magnetic field may be applied during the angled deposition to align the atoms of the magnetic material during deposition.

Figure 5:
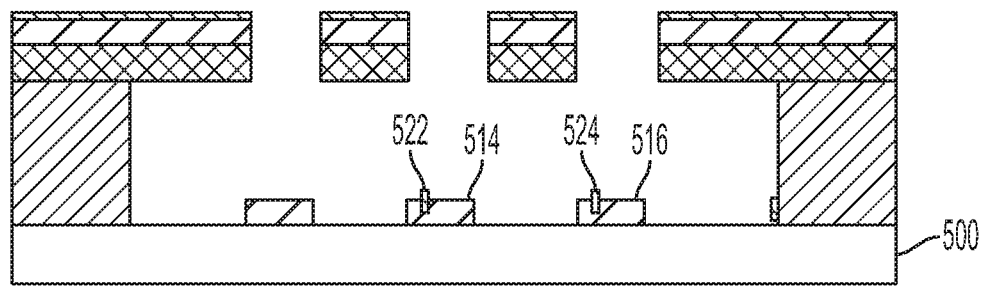
FIG. 5 is a schematic illustration of a cross-section of a substrate with a first region and a second region of superconducting material, each with a magnetic nanowire partially embedded therein according to an embodiment of the present invention.

The process includes annealing the magnetic material and the superconducting material to form a magnetic nanowire partially embedded in the superconducting material such that the magnetic nanowire and the superconducting material form a *Majorana* fermion structure. FIG. 5 is a schematic illustration of a cross-section of a substrate 500 with a first region 514 and a second region 516 of superconducting material, each with a magnetic nanowire partially embedded therein. A first magnetic nanowire 522 is embedded in the first region 514 of superconducting material, and a second magnetic nanowire 524 is embedded in the second region 516 of superconducting material. According to some embodiments of the present invention, the process includes applying a magnetic field during the annealing to increase atomic order in the magnetic nanowire. The regions of superconducting material and magnetic material may all be patterned in the same orientation on the substrate so that they are aligned with one another. For example, the regions of superconducting material and magnetic material may each have a width dimension, and a length dimension that is much greater than the width dimension. The length dimension of the regions of superconducting material and magnetic material may be parallel to one another.

Figure 6A:
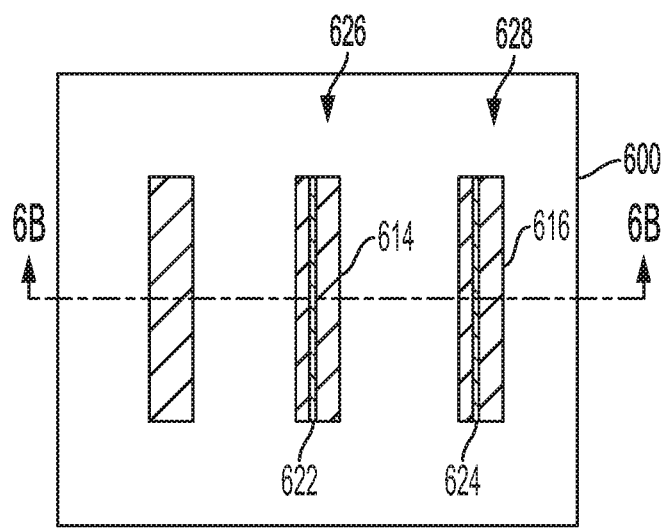
FIG. 6A is a schematic illustration of a plan view of a substrate with a first *Majorana* fermion structure and a second *Majorana* fermion structure formed thereon according to an embodiment of the present invention.
Figure 6B:
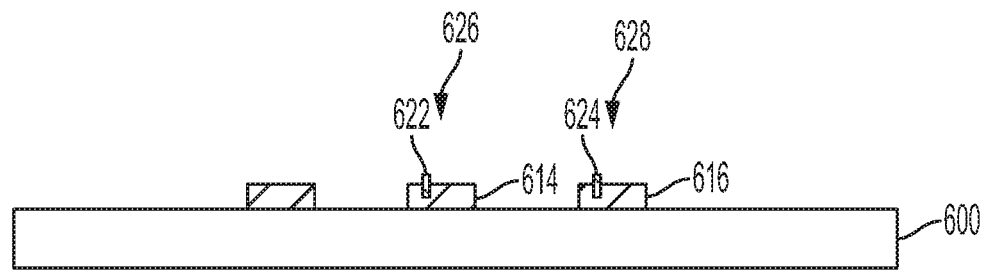
FIG. 6B is a schematic illustration of a cross-sectional view of a substrate with a first *Majorana* fermion structure and a second *Majorana* fermion structure formed thereon according to an embodiment of the present invention.

The process includes lifting off the support structure and hard mask, leaving behind a *Majorana* fermion structure formed on the substrate. FIGS. 6A and 6B are schematic illustrations of a plan view and a cross-sectional view of a substrate with a first *Majorana* fermion structure 626 and a second *Majorana* fermion structure 628 formed thereon.

According to some embodiments of the present invention, a quantum mechanical device includes a substrate 600, and an array of *Majorana* fermion structures 626, 628 formed on the substrate 600. Each *Majorana* fermion structure 626, 628 includes a superconducting material 614, 616 formed on the substrate 600, and a magnetic nanowire 622, 624 partially embedded in the superconducting material.

According to some embodiments of the present invention, the magnetic nanowires 622, 624 are aligned with the regions 614, 616 of superconducting material. Further, the magnetic material may be aligned with and embedded in the crystal lattice of the superconducting material. For example, an Fe nanowire may be aligned with and embedded in a Pb crystal lattice.

According to some embodiments of the present invention, each magnetic nanowire 622, 624 has a length direction parallel to a length direction of each other magnetic nanowire 622, 624 of the array of *Majorana* fermion structures 626, 628. The array of *Majorana* fermion structures may include two or more *Majorana* fermion structures. The *Majorana* fermion structures of the array may be positioned such that *Majorana* fermions may be transmitted from one *Majorana* fermion structure to another *Majorana* fermion structure. For example, each *Majorana* fermion structure may be separated from a nearest neighbor *Majorana* fermion structure by a distance of 200 nm or less.

The term "array" is intended to mean a plurality of structures that are deliberately positioned by the formation process, and not randomly distributed. For example, the first *Majorana* fermion structure 626 and the second *Majorana* fermion structure 628 schematically illustrated in FIGS. 6A and 6B form an array. The array may include *Majorana* fermion structures that are parallel or perpendicular to one another, or are arranged to form a pattern, such a grid pattern, a triangle pattern, or a hexagonal pattern, for example. The *Majorana* fermion structures in the array may be arranged sufficient close to one another to transfer quantum states from one magnetic nanowire to another. The *Majorana* fermion structures may be incorporated into a circuit. Each of the *Majorana* fermion structures in the array may have a uniform structure, such as a straight line, as opposed to a random structure such as a line of atoms connected to an agglomeration of atoms. The *Majorana* fermion structures may be used as qubit devices, or may be incorporated into qubit devices or other quantum mechanical devices.

According to some embodiments of the present invention, each magnetic nanowire is partially embedded in a different region of superconducting material than each other magnetic nanowire. Alternatively, multiple magnetic nanowires may be partially embedded in the same region of superconducting material. For example, angular deposition at a variety of angles may be used to form multiple magnetic nanowires on a single region of superconducting material.

Figure 7A:
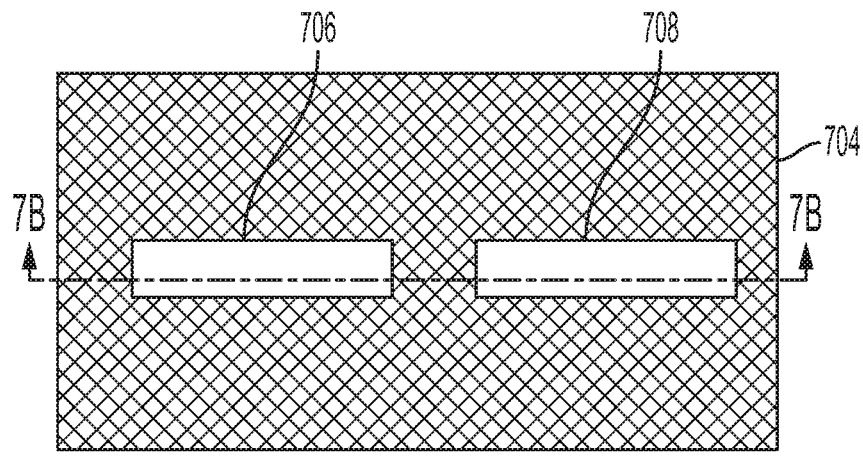
FIG. 7A is a schematic illustration of a plan view of a substrate with a lift off structure formed thereon according to an embodiment of the present invention.
Figure 7B:
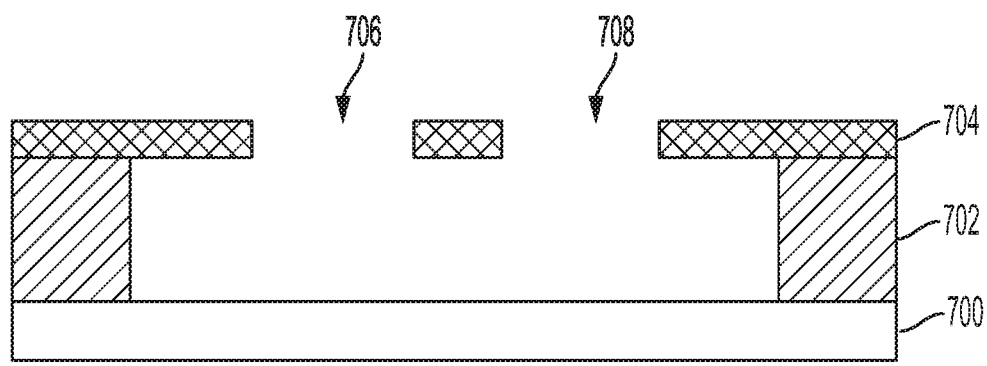
FIG. 7B is a schematic illustration of a cross-sectional view of a substrate with a lift off structure formed thereon according to an embodiment of the present invention.

Angular deposition at a variety of angles may also be used to form a continuous region of superconducting material, on which multiple magnetic nanowires may be formed. FIGS. 7A-10B are schematic illustrations of a process for forming a continuous region of superconducting material with an angular deposition mask. FIGS. 7A and 7B are schematic illustrations of a plan view and a cross-sectional view of a substrate 700 with a lift off structure formed thereon. The lift off structure includes a support structure 702 and a hard mask 704. The support structure 702 and hard mask 704 may be patterned to include through holes 706, 708.

Figure 8A:
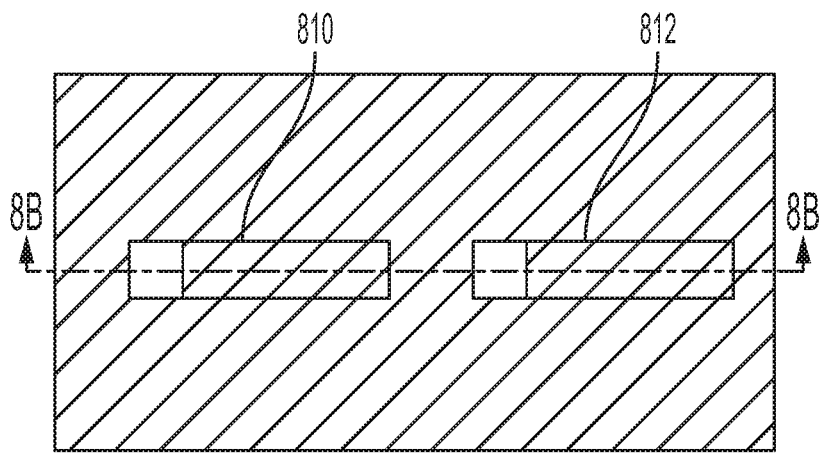
FIG. 8A is a schematic illustration of a plan view of a substrate with a superconducting material deposited thereon at a first angle according to an embodiment of the present invention.
Figure 8B:
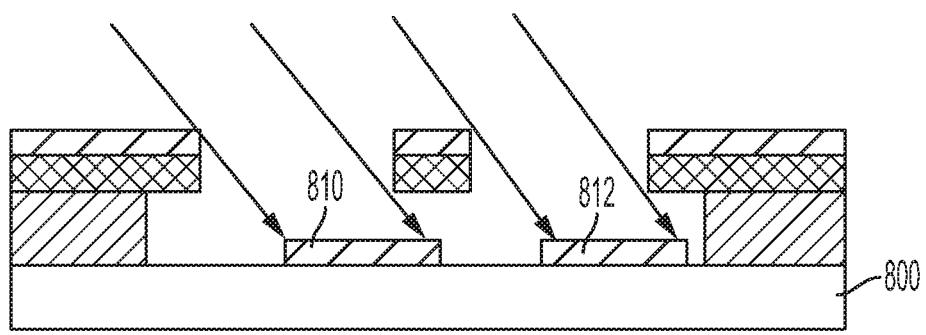
FIG. 8B is a schematic illustration of a cross-sectional view of a substrate with a superconducting material deposited thereon at a first angle according to an embodiment of the present invention.

The process includes depositing superconducting material at a first angle. FIGS. 8A and 8B are schematic illustrations of a plan view and a cross-sectional view of a substrate 800 with a superconducting material deposited thereon at a first angle. The superconducting material forms a first region 810 and a second region 812.

Figure 9A:
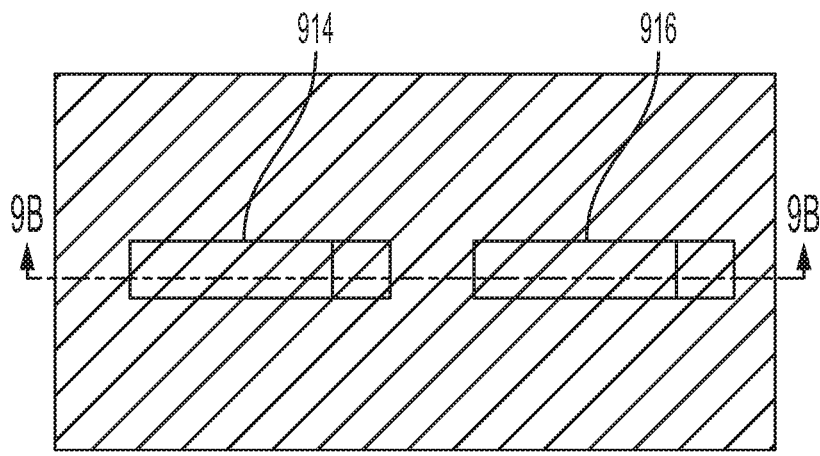
FIG. 9A is a schematic illustration of a plan view of a substrate with a superconducting material deposited thereon at a second angle according to an embodiment of the present invention.
Figure 9B:
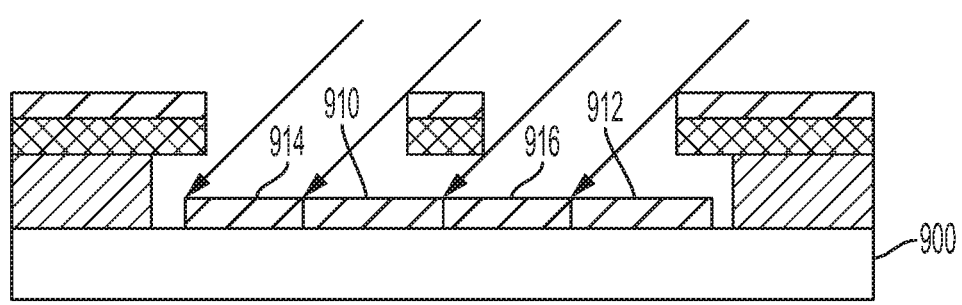
FIG. 9B is a schematic illustration of a cross-sectional view of a substrate with a superconducting material deposited thereon at a second angle according to an embodiment of the present invention.

The process includes depositing the superconducting material at a second angle. FIGS. 9A and 9B are schematic illustrations of a plan view and a cross-sectional view of a substrate 900 with a superconducting material deposited thereon at a second angle. The superconducting material forms a third region 914 in contact with the first region 910 and a fourth region 916 in contact with the first region 910 and the second region 912.

Figure 10A:
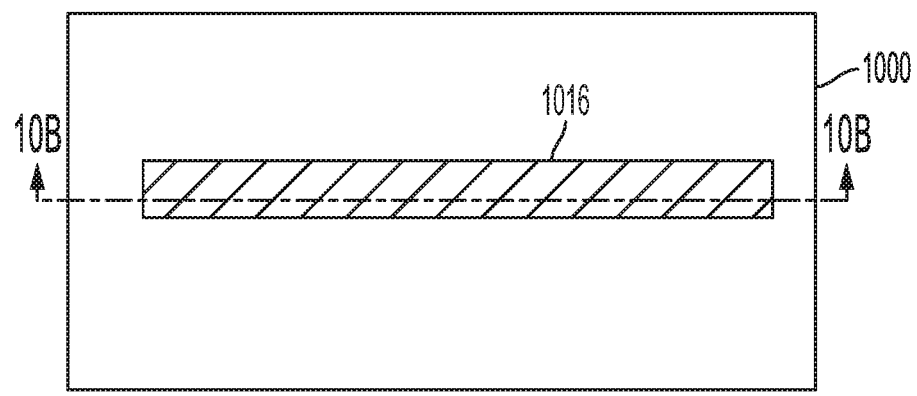
FIG. 10A is a schematic illustration of a plan view of a continuous superconducting region formed on a substrate according to an embodiment of the present invention.
Figure 10B:
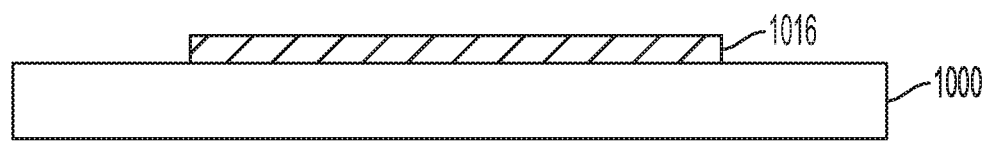
FIG. 10B is a schematic illustration of a cross-sectional view of a continuous superconducting region formed on a substrate according to an embodiment of the present invention.

As schematically illustrated in FIGS. 10A and 10B, the process results in a continuous superconducting region 1016 formed on the substrate 1000. However, prior to lifting off the hard mask, the hard mask may be used to form a plurality of magnetic nanowires on the continuous superconducting region 1016, for example, using the process schematically illustrated in FIGS. 4 and 5.

According to some embodiments of the present invention, the superconducting material of each *Majorana* fermion structure comprises a crystalline material, and each magnetic nanowire is aligned with a crystalline lattice of the superconducting material. A magnetic field may be applied during deposition and/or annealing of the magnetic material to align the magnetic nanowire with the crystalline lattice of the superconducting material.

A process for fabricating a *Majorana* fermion structure may include using a method for fabricating a *Majorana* fermion device includes p a structure includes magnetic nanowires oriented using a magnetic field, and a superconductor wire. The oriented magnetic nanowires are formed on the superconductor wire to fabricate a *Majorana* fermion device.

a method for fabrication of a *Majorana* fermion structure includes patterning a double angle lift off mask on a substrate. The method includes depositing a Pb superconducting metal on the substrate at a first angle, and depositing a Fe magnetic nanowire on the superconducting metal at a second angle relative to the first angle. The method includes annealing to align and embed the Fe magnetic nanowire in the Pb superconducting metal crystal lattice.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a *Majorana* fermion structure, comprising:
   providing a substrate;
   depositing a superconducting material on said substrate;
   depositing a magnetic material on said superconducting material using angled deposition through a mask; and
   annealing said magnetic material and said superconducting material to form a magnetic nanowire partially embedded in said superconducting material such that said magnetic nanowire and said superconducting material form a *Majorana* fermion structure.

2. The method for fabricating a *Majorana* fermion structure according to claim 1, further comprising applying a magnetic field to said magnetic material and said superconducting material during said annealing said magnetic material and said superconducting material to form said magnetic nanowire.

3. The method for fabricating a *Majorana* fermion structure according to claim 2, wherein said magnetic field is applied such that field lines of said magnetic field align with a desired length direction of said magnetic nanowire.

4. The method for fabricating a *Majorana* fermion structure according to claim 1, wherein depositing said superconducting material comprises:
   forming said mask on said substrate;
   patterning said mask to expose a portion of said substrate; and
   depositing said superconducting material on said exposed substrate.

5. The method for fabricating a *Majorana* fermion structure according to claim 4, wherein depositing said magnetic material on said superconducting material comprises:
   depositing said magnetic material on said superconducting material using angular deposition through said patterned mask.

6. The method for fabricating a *Majorana* fermion structure according to claim 2, further comprising applying said magnetic field during said depositing said magnetic material on said superconducting material.

7. The method for fabricating a *Majorana* fermion structure according to claim 1, wherein said superconducting material has a width between 10 nm and 30 nm.

8. The method for fabricating a *Majorana* fermion structure according to claim 1, wherein depositing said magnetic material on said superconducting material comprises depositing said magnetic material to have a width less than or equal to 10 nm.

9. The method for fabricating a *Majorana* fermion structure according to claim 1, wherein depositing said magnetic material on said superconducting material comprises depositing a monolayer of said magnetic material.

10. The method for fabricating a *Majorana* fermion structure according to claim 1, wherein said superconducting material comprises Pb.

11. The method for fabricating a *Majorana* fermion structure according to claim 1, wherein said magnetic nanowire comprises Fe.

12. The method for fabricating a *Majorana* fermion structure according to claim 1, wherein said magnetic nanowire comprises Ni.

13. The method for fabricating a *Majorana* fermion structure according to claim 1, wherein said magnetic nanowire comprises Co.

14. The method for fabricating a *Majorana* fermion structure according to claim 1, wherein said magnetic nanowire comprises Ni and Co.

15. The method for fabricating a *Majorana* fermion structure according to claim 1, further comprising:
   forming a second region of said superconducting material on said substrate in proximity with said first-mentioned superconducting material, said second region of superconducting material having a length direction parallel to a length direction of said first-mentioned superconducting material; and
   forming a second magnetic nanowire partially embedded in said second region of said superconducting material.

16. A *Majorana* fermion structure fabricated according to the method of claim 1.

17. A quantum mechanical device, comprising:
   a substrate; and
   an array of *Majorana* fermion structures formed on the substrate, comprising:
      a plurality of separate superconducting structures material formed on said substrate; and
      a plurality of separate magnetic nanowires each partially embedded in a corresponding one of said plurality of separate superconducting structures.

18. The quantum mechanical device according to claim 17, wherein each magnetic nanowire of said plurality of magnetic nanowires has a length direction parallel to a length direction of each other magnetic nanowire,
   wherein each separate superconducting structure of said plurality of separate superconducting structures has a length direction parallel to a length direction of each other superconducting structure, and
   wherein each separate superconducting structure is separated by less than 200 nm from an adjacent separate superconducting structure.

19. The quantum mechanical device according to claim 17, wherein each magnetic nanowire has a width of at least 5 nm and less than 10 nm,
   wherein each superconducting structure has a width of at least 50 nm and less than 100 nm, and
   wherein each superconducting structure is at least 500 nm long along a length direction.

20. The quantum mechanical device according to claim 17, wherein said superconducting material of each *Majorana* fermion structure comprises a crystalline material, and
   wherein each magnetic nanowire is aligned with a crystalline lattice of said superconducting material.

* * * * *